(12) United States Patent
Hsu et al.

(10) Patent No.: US 10,084,056 B1
(45) Date of Patent: Sep. 25, 2018

(54) SEMICONDUCTOR STRUCTURE AND METHOD OF MANUFACTURING THE SAME

(71) Applicant: TAIWAN SEMICONDUCTOR MANUFACTURING CO., LTD., Hsinchu (TW)

(72) Inventors: Hung-Wen Hsu, Tainan (TW); Hung-Ling Shih, Tainan (TW); Jiech-Fun Lu, Tainan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/463,088

(22) Filed: Mar. 20, 2017

(51) Int. Cl.
*H01L 21/302* (2006.01)
*H01L 29/49* (2006.01)
*H01L 27/06* (2006.01)
*H01L 21/311* (2006.01)
*H01L 29/423* (2006.01)
*H01L 29/40* (2006.01)
*H01L 29/66* (2006.01)
*H01L 21/768* (2006.01)

(52) U.S. Cl.
CPC .... *H01L 29/4916* (2013.01); *H01L 21/31116* (2013.01); *H01L 27/0617* (2013.01); *H01L 29/401* (2013.01); *H01L 29/42376* (2013.01); *H01L 29/6656* (2013.01); *H01L 21/76837* (2013.01)

(58) Field of Classification Search
CPC .............. H01L 21/31116; H01L 21/76837
See application file for complete search history.

(56) References Cited

U.S. PATENT DOCUMENTS

| | | | |
|---|---|---|---|
| 6,645,353 B2 * | 11/2003 | Huff | H01L 21/31116 257/E21.252 |
| 6,762,125 B1 * | 7/2004 | Polinsky | H01L 21/31105 438/694 |
| 8,546,274 B2 * | 10/2013 | Hohage | H01L 21/823807 438/783 |

* cited by examiner

*Primary Examiner* — Chandra Chaudhari
(74) *Attorney, Agent, or Firm* — McClure, Qualey & Rodack, LLP (57) ABSTRACT

A method of manufacturing a semiconductor structure is provided. An interlayer dielectric layer is formed conformally over protruding structures formed over a silicon substrate and a surface of the silicon substrate. Next, a vaporized chemical etching operation is performed to the interlayer dielectric layer, so as to form a gap between two adjacent protruding structures. The gap has a target aspect ratio of at least 4, a top portion of the interlayer dielectric layer above an upper portion of each of the at least two protruding structures is trimmed at a first etching rate, and a bottom portion of the interlayer dielectric layer above a base portion of each of the at least two protruding structures is etched at a second etching rate smaller than the first etching rate, for enlarging the deposition process window and preventing voids from remaining inside a gap filling material in the gap.

20 Claims, 9 Drawing Sheets

SEMICONDUCTOR STRUCTURE AND METHOD OF MANUFACTURING THE SAME

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a stacked gate electrode to improve device performance with the decreased feature sizes and high aspect ratios.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed.

As used herein, the term "and/or" includes any and all combinations of one or more of the associated listed items.

Embodiments of the present disclosure are directed to a semiconductor structure that may enlarge a process window for subsequent deposition of a dielectric material (e.g., between spacer features of two protruding structures over a substrate), which prevents voids remaining inside a gap filling material subsequently disposed without loss of spacer heights and widths.

Figure 1A:
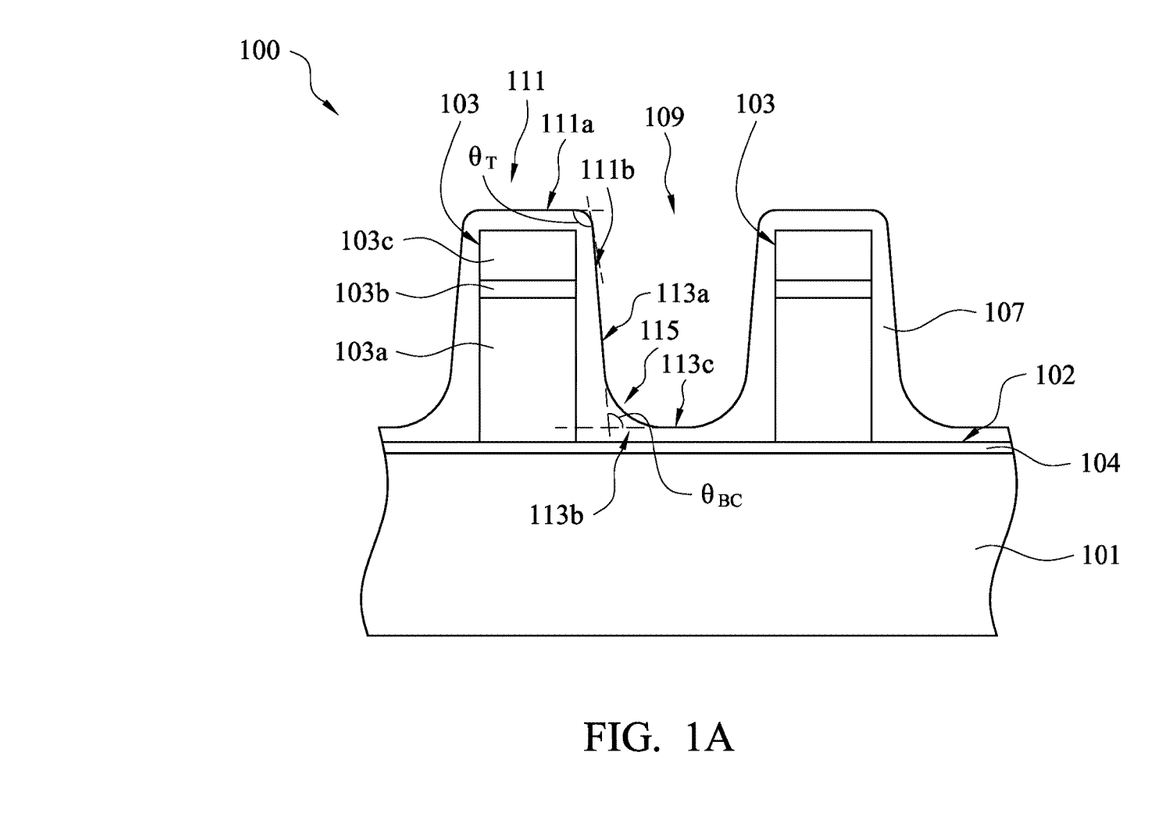
FIGS. 1A and 1B are schematic cross-sectional views of a semiconductor structure in accordance with various embodiments.

Referring to FIG. 1A, FIG. 1A is a schematic cross-sectional view of a semiconductor structure 100 in accordance with embodiments. In FIG. 1A, in some embodiments, a semiconductor structure 100 includes a silicon substrate 101, at least two protruding structures 103 disposed over the silicon substrate 101, in which every two adjacent protruding structures 103 are spaced at a gap 109. The silicon substrate 101 may be n-type or p-type, and may be a bulk silicon substrate or a silicon-on-insulator (SOI) substrate. Generally, the silicon substrate 101 is planar with a uniform thickness. In some embodiments, the surface 102 is a top surface of the silicon substrate 101 itself, but, in certain embodiments, the silicon substrate 101 may optionally have an oxide layer 104 formed thereon, and the surface 102 is defined as a top surface of the oxide layer 104.

In some embodiments such as flash memory applications, each of the at least two protruding structures 103 may be a gate structure or a gate stack that includes a gate polysilicon layer 103a, a dielectric layer 103b disposed on the gate polysilicon layer 103a, a control gate layer 103c disposed on the dielectric layer 103b. In some examples, the gate polysilicon layer 103a may be a floating gate polysilicon layer, and the gate polysilicon layer 103a and the control gate polysilicon layer 103c may be doped with impurities in accordance with actual requirements.

In some embodiments, an interlayer dielectric layer 107 is disposed conformally over the protruding structures 103 and a surface 102 of the silicon substrate 101 in the gap 109. In certain examples, the interlayer dielectric layer 107 has a top portion 111 and a bottom portion 113b in the gap 109, the top portion 111 is located near tops (not shown in figures) of the protruding structures 103, and the bottom portion 113b is located near bottoms (not shown in figures) of the protruding structures 103.

In some embodiments, a gap 109 in the interlayer dielectric layer 107 is defined between the two adjacent protruding structures 103. The interlayer dielectric layer 107 in the gap 109 may have a desired gap profile with a target aspect ratio of not less than 4, and a cross-sectional gap profile defined by a first angle $\theta_T$ and a second angle $\theta_{BC}$. In certain embodiments, the interlayer dielectric layer 107 in the gap 109 may have the gap profile with the target aspect ratio of at least 4.1, at least 4.2, at least 4.3 or at least 4.4.

In certain embodiments, the first angle $\theta_T$ defined between a top surface 111a and a top sidewall 111b of the interlayer dielectric layer 107 may be at least 91 degrees, and the second angle $\theta_{BC}$ between a bottom sidewall 113a and a bottom surface 113c (i.e. at a bottom corner 115) of the interlayer dielectric layer 107 may be at least 91 degrees. In other embodiments, the first angle $\theta_T$ may be in a range substantially from 91 degrees to 97 degrees, and the second angle $\theta_{BC}$ may be in a range substantially from 91 degrees to 126 degrees. In some examples, the first angle $\theta_T$ may be in a range substantially from 91 degrees to 93 degrees, from 93 degrees to 95 degrees, or from 95 degrees to 97 degrees. In certain examples, the second angle $\theta_{BC}$ may be in a range substantially from 91 degrees to 96 degrees, from 96 degrees to 101 degrees, from 101 degrees to 106 degrees, from 106 degrees to 111 degrees, from 111 degrees to 116 degrees, from 116 degrees to 121 degrees, or from 121 degrees to 126 degrees. In other examples, the second angle $\theta_{BC}$ may be larger than 126 degrees. Such profile of the interlayer dielectric layer 107 may enlarge the subsequent deposition process window and prevent voids remaining inside a gap filling material subsequently filling the gap 109 without loss of the heights and widths of the spacers.

Figure 1B:
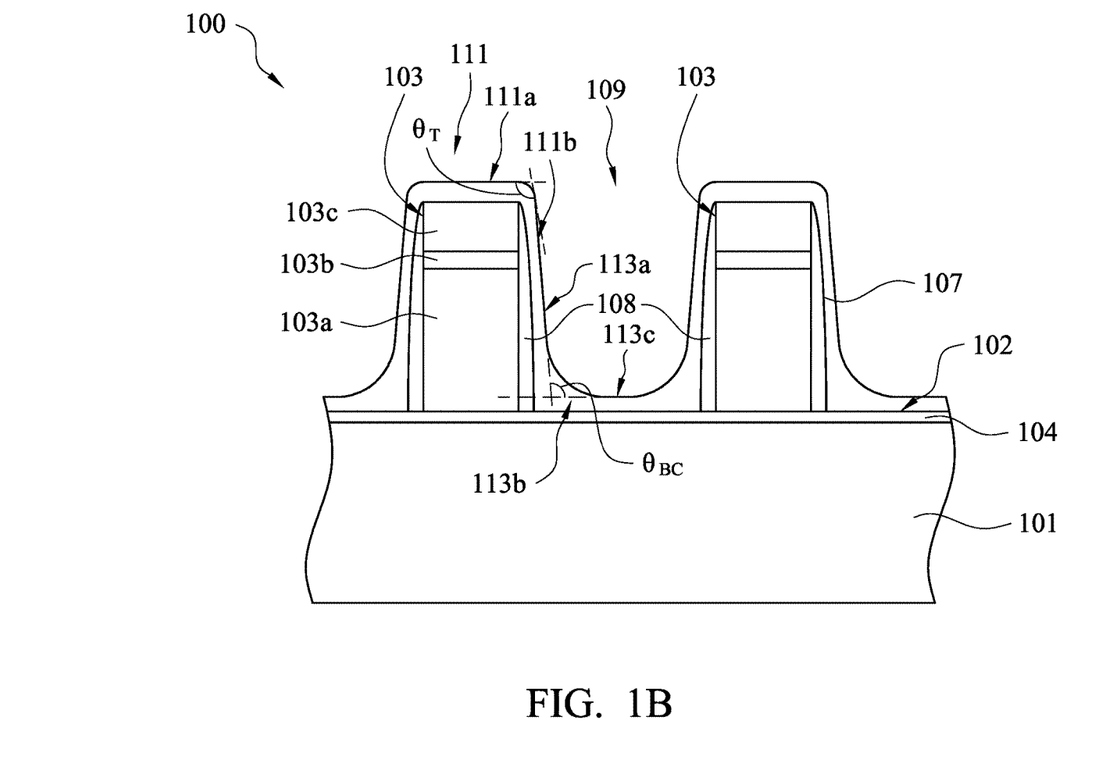

In those embodiments of FIG. 1A, the interlayer dielectric layer 107 may act as spacers. However, in other embodiments, the spacers may be optionally disposed along sidewalls formed by the gate polysilicon layer, the dielectric layer and the control gate layer. In these embodiments, as shown in FIG. 1B, which is a cross-sectional view of a semiconductor structure 100 in accordance with embodiments, typical spacers 108 may be optionally disposed along sidewalls of the protruding structures 103 including the gate polysilicon layer 103a, the dielectric layer 103b and the control gate layer 103c, and the interlayer dielectric layer 107 may be disposed over the protruding structures, the spacers 108 and a surface 102 of the silicon substrate 104, so as to protect the spacers 108 without damage or loss of the heights and widths of the spacers in subsequent processes.

In addition, embodiments of the present disclosure directed to a method of manufacturing a semiconductor structure are further provided. Reference is made to FIGS. 2A-2F, in which FIGS. 2A to 2F are schematic cross-sectional views of intermediate stages showing a method of fabricating a semiconductor structure in accordance with various embodiments.

Figure 2A:
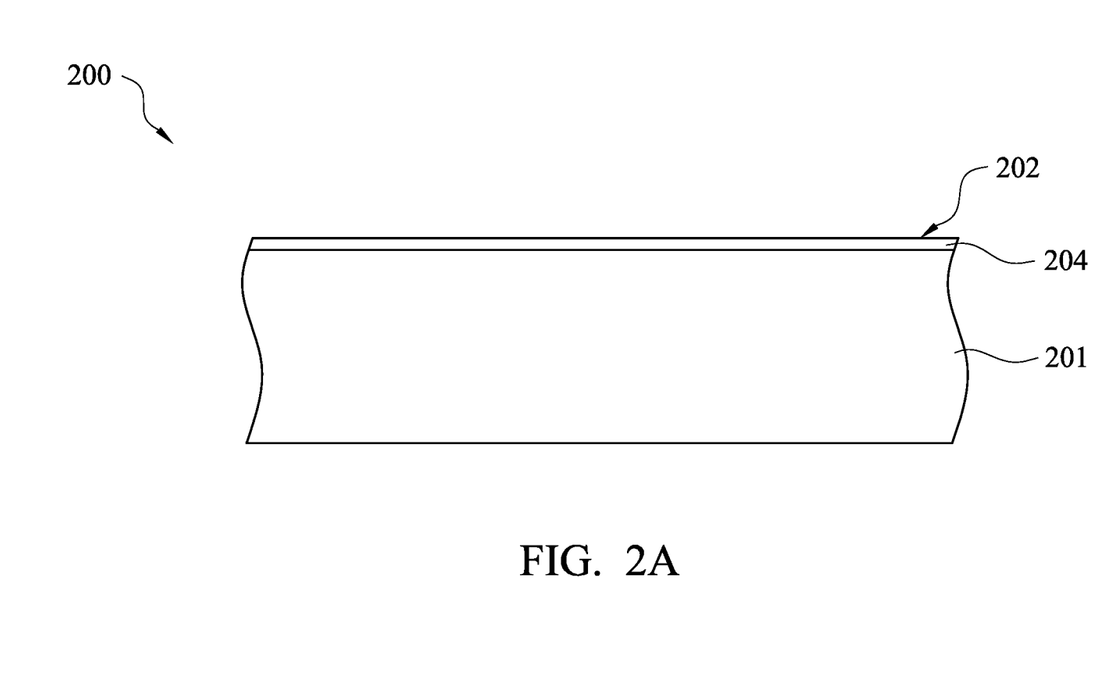
FIGS. 2A to 2F are schematic cross-sectional views of intermediate stages showing a method of fabricating a semiconductor structure in accordance with various embodiments.

In some embodiments, as shown in FIG. 2A, at operation 301, a silicon substrate 201 is provided. The silicon substrate 201 may be n- or p-type, and can, for example, be a bulk silicon substrate or a silicon-on-insulator (SOI) substrate. Generally, the silicon substrate 201 is planar with a uniform thickness. In some embodiments, the silicon substrate 201 may optionally have an oxide layer 204 above thereon.

Figure 2B:
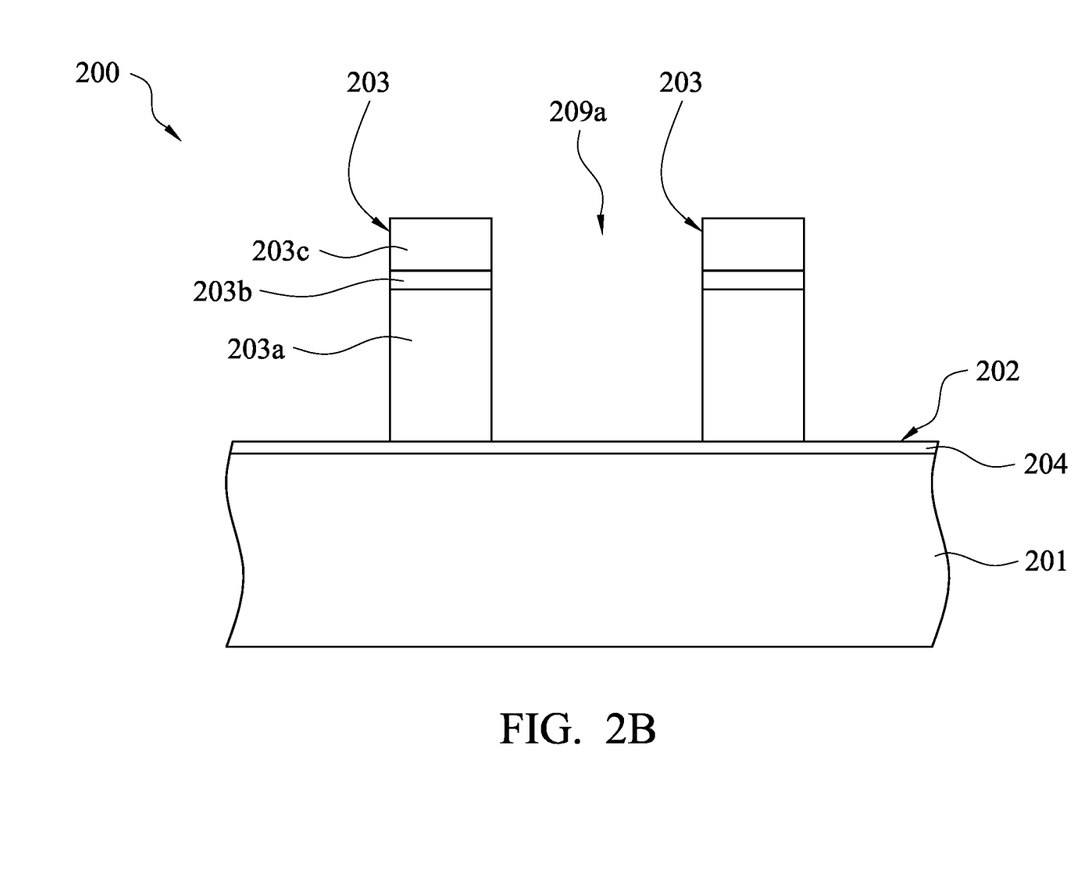

Next, as shown in FIG. 2B, at operation 303, at least two protruding structures 203 are formed adjacently over the silicon substrate 201, and a gap 209a is formed between the protruding structures 203. In some embodiments, the protruding structures 203 may be optionally formed on the oxide layer 204 of the silicon substrate 201. In certain embodiments such as flash memory applications, each of the protruding structures 203 may include may be a gate structure or a gate stack that includes a various material layers, for example, a gate polysilicon layer 203a, an inter-polysilicon dielectric layer 203b overlaying the gate polysilicon layer 203a, and a control gate layer 203c overlaying the inter-polysilicon dielectric layer 203b. In some examples, the gate polysilicon layer 203a may be a floating gate polysilicon layer, and the gate polysilicon layer 203a and the control gate polysilicon layer 203c may be doped with impurities in accordance with actual requirements.

Figure 2C:
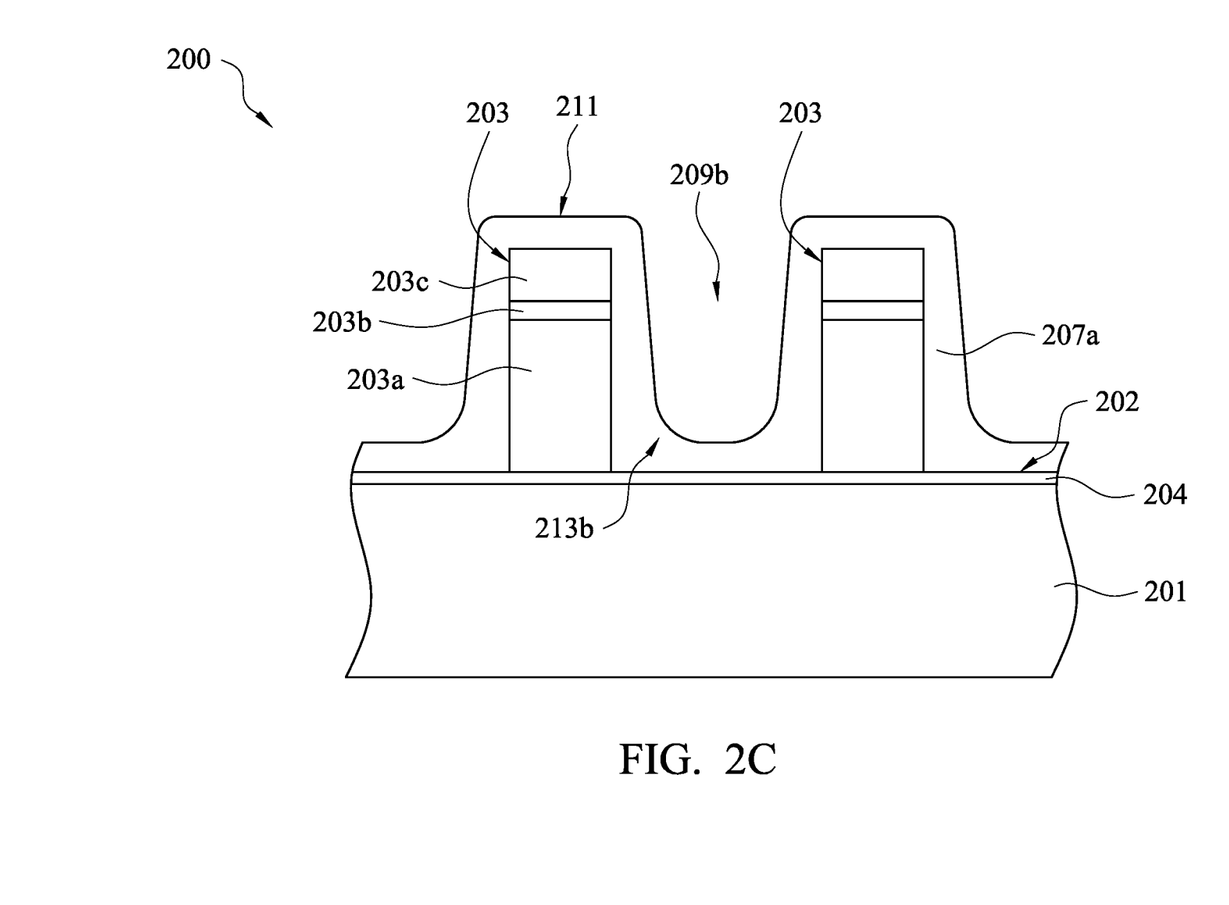
Figure 3:
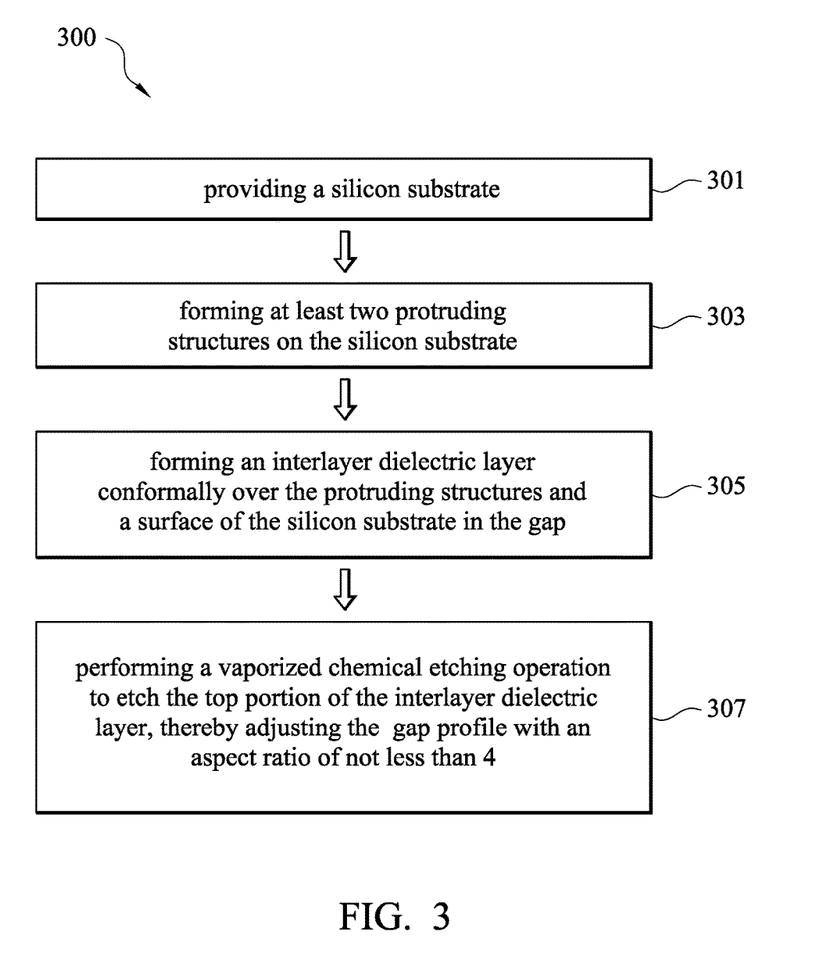
FIG. 3 is a flow chart of a method of manufacturing a semiconductor structure in accordance with embodiments.

Then, as shown in FIG. 2C, at operation 305 of FIG. 3, an interlayer dielectric layer 207a may be formed conformally over the protruding structures 203 and a surface 202 of the silicon substrate 201 in a gap 209b between the protruding structures 203, in which the interlayer dielectric layer 207b has a top portion 211 and a bottom portion 213b, the bottom portion 213b adjoining the top portion 211, the top portion 211 is located near tops (not shown in figures) of the protruding structures 203, and the bottom portion 213b is located near bottoms (not shown in figures) of the protruding structures 203. The interlayer dielectric layer 207a may include a single layer or multilayers made of multiple dielectric materials, such as silicon oxide, silicon dioxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In certain embodiments, the inter-layer dielectric layer 207a may be formed by chemical vapor deposition (CVD), physical vapor deposition, (PVD), atomic layer deposition (ALD), spin-on coating, or other applicable processes.

In some embodiments, the surface 202 is defined as a superior side of the silicon substrate 201 itself; however, in other embodiments, the silicon substrate 201 may optionally have an oxide layer 204 or other material layers (not shown in figures) formed thereon, and the surface 202 may be defined as a superior side of the oxide layer 204 or the other material layers (not shown in figures).

Figure 2D:
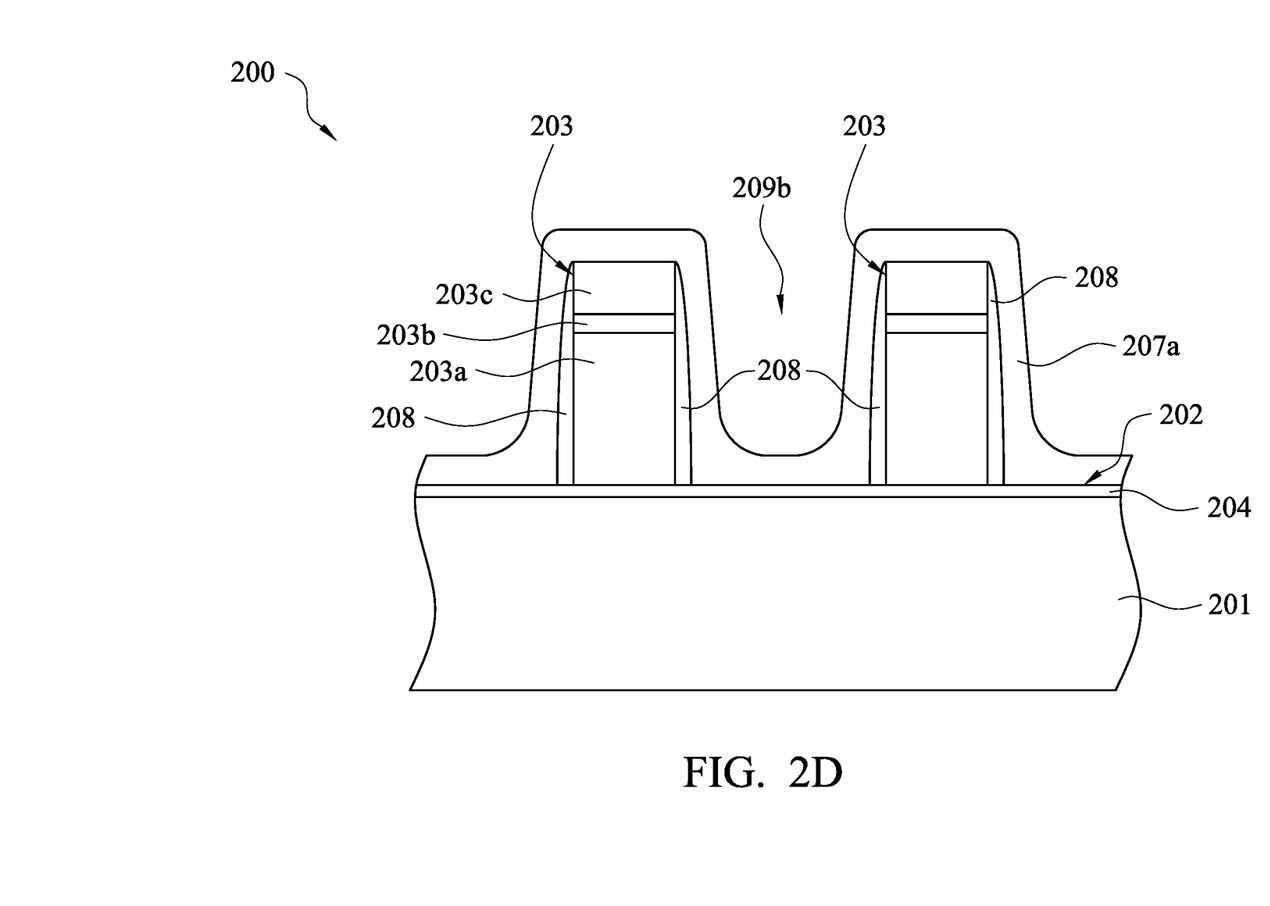

In some embodiments, the interlayer dielectric layer 207a may serve as spacers of the protruding structures 203 in the case without spacers. FIG. 2D is a schematic cross-sectional view of intermediate stages showing a method of fabricating a semiconductor structure 200 in accordance with other embodiments. Alternatively, in other embodiments (as that shown in FIG. 2D) at operation 305, typical spacers 208 may be optionally disposed along sidewalls of the protruding structures 203 including the gate polysilicon layer 203a, the dielectric layer 203b and the control gate layer 203c. In these cases, the interlayer dielectric layer 207a may be over the protruding structures 203, the spacers 208 and a surface 202 of the silicon substrate 201, so as to protect the spacers 208 without damage or loss of the heights and widths of the spacers in subsequent processes. Hereinafter, subsequent treatments may be performed to the structure of FIG. 2C (omitting spacers) or FIG. 2D (having spacers).

Figure 2E:
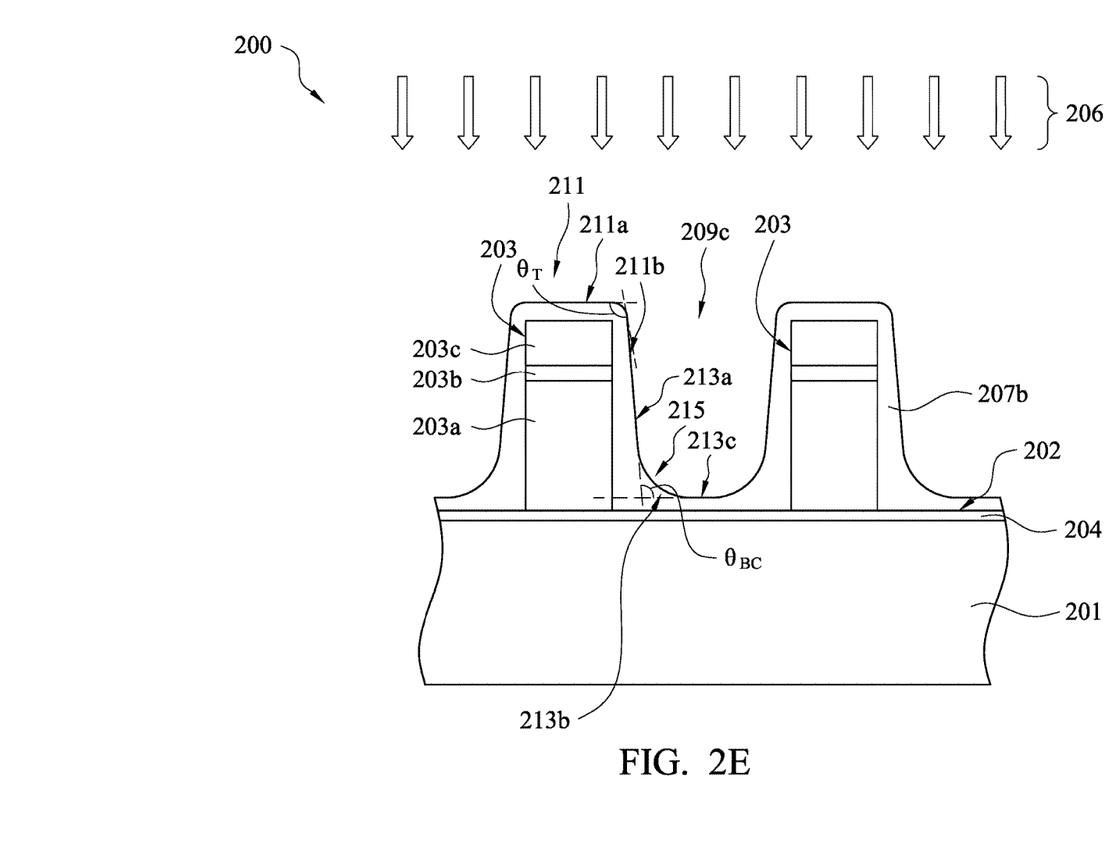

Subsequently, as shown in FIG. 2E, at operation 307 of FIG. 3, at least one vaporized chemical etching operation 206 is performed to treat the interlayer dielectric layer 207a, so as to modify a surface/cross-sectional profile thereof, thus adjusting the gap profile of the interlayer dielectric layer 207b in the gap 209c between the protruding structures 203.

In the embodiments, the number of performing the vaporized chemical etching operation is not limited to a specific number of times, and the at least one vaporized chemical etching operation may be performed one or more times according to a desired gap profile through trimming the interlayer dielectric layer (e.g., from the profile of layer 207a shown in FIG. 2C or 2D to the profile of the dielectric layer 207b as shown in FIG. 2E).

In some embodiments, a vaporized chemical etching operation 206 is performed to etch the top portion 211 of the interlayer dielectric layer 207a at a first etching rate and the bottom portion 213b of the interlayer dielectric layer at a second etching rate that is smaller than the first etching rate, thereby adjusting a desired gap profile of the interlayer dielectric layer 207b in the gap 209c between the protruding structures 203.

In other embodiments, the vaporized chemical etching operation 206 also includes one or more vaporized chemical etching operations, and the vaporized chemical etching operation 206 may be referred to a first vaporized chemical etching operation 206 and a second vaporized chemical etching operation 206. In these embodiments, a first vaporized chemical etching operation 206 is performed to etch the top portion 211 of the interlayer dielectric layer 207a at a first etching rate and the bottom portion 213b of the interlayer dielectric layer 207a at a second etching rate that is equal to or smaller than the first etching rate. Following, at least one second vaporized chemical etching operation 206 is performed by adjusting the first etching rate to be a third etching rate to further etch the top portion 211 of the interlayer dielectric layer 207a and adjusting the second etching rate to be a fourth etching rate to further etch the bottom portion 213b of the interlayer dielectric layer 207a until a desired gap profile of the interlayer dielectric layer 207b in the gap 209c is achieved, in which the fourth etching rate is smaller than the third etching rate, and the desired gap profile has an aspect ratio of not less than 4.

The interlayer dielectric layer 207b in the gap 209c has a gap profile with a target aspect ratio that is not less than at least 4 and an appropriate thickness. In certain embodiments, the gap profile may have a target aspect ratio of not less than at least 4.1, at least 4.2, at least 4.3 or at least 4.4. In some examples, it is not intended to limit the thickness of the interlayer dielectric layer 207b, however the thickness of the interlayer dielectric layer 207a may be exemplified as at least 200 angstroms (Å) before the vaporized chemical etching operation 206 is performed.

In these embodiments, suitable gaseous or vaporized chemical reactants may serve as source gases of the vaporized chemical etching operation. The vaporized chemical etching operation may be performed at high temperatures, or at low temperatures and low pressure in combination with radio frequency (RF)-induced plasma discharges, so as to generate active species such as free radicals and excited neutral species in anisotropic direction. In some embodiments, during the at least one vaporized chemical etching operation, the semiconductor structure 200 is immersed in a reactive gas (plasma) mostly controlled by the source power of an etching tool (not shown in figures) under a relatively low gas pressure. There is no specific limitation on the vaporized chemical reactant depending on the actual requirements. For example, when the interlayer dielectric layer 207a includes silicon dioxide, a halogen-containing gas (e.g. a fluorine-containing gas such as carbon tetrafluoride ($CF_4$), $CHF_3$, $C_4F_8$ and so on may be chosen as the vaporized chemical reactant, in the presence of oxygen gas, to perform the vaporized chemical etching operation under the recipes of typical dry etching operations such as reactive-ion etching (RIE), magnetically enhanced-RIE (MERIE), inductively coupled plasma (ICP) etching, electron cyclotron resonator (ECR) etching or appropriate dry etching operations.

In some embodiments, a thickness of the top portion 211 of the interlayer dielectric layer 207a may be reduced by a first thickness, a bottom corner 215 of the interlayer dielectric layer 207a may be reduced by a second thickness, depending on times (or cycles) of the at least one vaporized chemical etching operation. In some embodiments, a ratio of the first thickness to the second thickness may be in a range substantially from 1/1 to 30/1 after the at least one vaporized chemical etching operation. In other embodiments, the ratio of the first thickness to the second thickness may be in a range substantially from 1/1 to 10/1, or in a range substantially from 1/1 to 5/1 in certain examples.

In one example, after the vaporized chemical etching operation is performed once, the thickness of the top portion 211 of the interlayer dielectric layer 207a is reduced by a first thickness of approximately 30 angstroms (Å), a bottom corner 215 of the interlayer dielectric layer 207a may be reduced by a second thickness of approximately 30 Å. In another example, after the vaporized chemical etching operation is performed twice continuously, the thickness of the top portion 211 of the interlayer dielectric layer 207a is reduced by a first thickness of approximately 120 Å, a bottom corner 215 of the interlayer dielectric layer 207a may be reduced by a second thickness of approximately 40 Å. In one another examples, after the vaporized chemical etching operation is performed thrice continuously, the thickness of the top portion 211 of the interlayer dielectric layer 207a is reduced by a first thickness of approximately 180 Å, a bottom corner 215 of the interlayer dielectric layer 207a may be reduced by a second thickness of approximately 90 Å. However, in other examples, after the vaporized chemical etching operation is performed more than three times, for meeting the ratio of the first thickness to the second thickness in the ranges substantially from 1/1 to 30/1.

During the at least one vaporized chemical etching operation, a top portion 211 of the interlayer dielectric layer 207a of FIG. 2C or 2D above an upper portion of each of the at least two protruding structures 203 may be trimmed at a first etching rate, and a bottom portion 213b of the interlayer dielectric layer 207a of FIG. 2C or 2D above a bottom of each of the at least two protruding structures 203 may be etched at a second etching rate that is smaller than the first etching rate. In certain examples, the first etching rate and the third etching rate may be controlled by a source power of an etching tool (not shown in figures), and the second etching rate and the fourth etching rate may be controlled by a bias power of the etching tool, and a ratio of the source power to the bias power may be at least 10/1. In other embodiments, the first etching rate may be controlled by a source power of the etching tool, and the second etching rate may be controlled by a bias power of the etching tool, and a ratio of the source power to the bias power may be in a range substantially from 10/1 to 20/1. In other embodiments, for achieving better surface/cross-sectional profile of the gap profile of the interlayer dielectric layer 207b in the gap 209 between the protruding structures 203, the bias power of the etching tool may be close to or substantially equal to zero, and the at least one vaporized chemical etching operation may be mostly or completely performed only by the source power of the etching tool.

In those embodiments, the etching tool may be, for examples, a RIE apparatus, a MERIE apparatus, an ICP etching apparatus, an ECR etching apparatus or other appropriate etching apparatuses.

In the case of etching a typical gap profile with a high aspect ratio of not less than at least 4, the source power controls the plasma density, the bias power adjusts the bombardment of the reactive gas species at the surface 202 of the silicon substrate 201, and the ratio of the source power to the bias power is typically less than 10/1, for providing more bombardment of the reactive gas species at the surface 202 of the silicon substrate 201 to forming the gap profile of the interlayer dielectric layer with the high aspect ratio. However, in the case of etching the interlayer dielectric layer 207a, when the ratio of the source power to the bias power is typically less than 10/1, the bombardment of the reactive gas species is relatively strong, and the top portion 211 of the interlayer dielectric layer 207a may be over-etched to partially expose the underlying protruding structures 203, for example, the control gate layer 203c. Moreover, the undesirably wider opening of gap 209 and the decreased height of spacers (not shown in FIG. 2B) would not contribute an appropriate profile to create a subsequent deposition process window of a gap filling material, even leading voids formed in the gap filling material in the gap with such high aspect ratio.

With regarding to a typical gap having the target aspect ratio that is not less than 4, the typical gap has a cross-sectional profile defined by a first angle $\theta_T$ included between a top surface of the interlayer dielectric layer and a top sidewall of the interlayer dielectric layer, a second angle $\theta_{BC}$ included between a bottom sidewall of the interlayer dielectric layer and a bottom surface of the interlayer dielectric layer, the first angle $\theta_T$ is smaller than 91 degrees and a second angle $\theta_{BC}$ is smaller than 91 degrees. In subsequent processes, such gap is often filled by a gap filling material with voids therein. For example, in a typical method of manufacturing a semiconductor structure with a gap having a target aspect ratio that is not less than 4, the semiconductor structure is reoxidized for forming a reoxidized layer conformally above the protruding structures and a surface of the silicon substrate. Then, the reoxidized layer is etched back by a wet etching operation of hydrofluoric acid, for forming spacers and enlarging the gap-filling performance. However, an opening of the gap is undesirably widened due to some drawbacks such as damage or loss of the heights and widths of the spacers during the wet etching operation. Such profile of the spacers after the wet etching operation adversely affects the subsequent deposition process window, leading to voids remaining inside the gap filling material in the gap.

Alternatively, in another typical method of manufacturing a semiconductor structure with a gap having a target aspect ratio that is not less than 4, spacers are disposed along sidewalls of the protruding structures, and a bottom anti-reflection coating (BARC) layer may be formed on the substrate and between every two adjacent protruding structures. Then, the BARC layer is etched back by a wet etching operation of hydrofluoric acid, for enlarging the gap-filling performance. However, an opening of the gap is undesirably widened due to some drawbacks such as damage or loss of the heights and widths of the spacers during the wet etching operation. Such profile of the spacers after the wet etching operation adversely affects the subsequent deposition process window, leading to voids remaining inside the gap filling material in the gap.

It is noted that, in some embodiments, when the source power and the bias power are controlled at the aforementioned ratios, as well as the ratio of the first thickness to the second thickness controlled at the aforementioned ranges, the gap 209 may have a cross-sectional profile defined by a first angle $\theta_T$ and a second angle $\theta_{BC}$.

In these embodiments, a first angle $\theta_T$ included between the top surface 211a and a top sidewall 211b of the interlayer dielectric layer 207b may be in a range substantially from 91 degrees to 97 degrees, and a second angle $\theta_{BC}$ included between a bottom sidewall 213a and a bottom surface 213c (i.e. at a bottom corner 215) of the interlayer dielectric layer 207b may be at least 91 degrees.

In other embodiments, the first angle $\theta_T$ may be in a range substantially from 91 degrees to 97 degrees, and the second angle $\theta_{BC}$ may be in a range substantially from 91 degrees to 126 degrees. In some examples, the first angle $\theta_T$ may be in a range substantially from 91 degrees to 93 degrees, from 93 degrees to 95 degrees, or from 95 degrees to 97 degrees. In certain examples, the second angle $\theta_{BC}$ may be in a range substantially from 91 degrees to 96 degrees, from 96 degrees to 101 degrees, from 101 degrees to 106 degrees, from 106 degrees to 111 degrees, from 111 degrees to 116 degrees, from 116 degrees to 121 degrees, or from 121 degrees to 126 degrees. In other examples, the second angle $\theta_{BC}$ may be larger than 126 degrees.

It should be emphasized that, there is no additional step or treatment between the step of forming the interlayer dielectric layer and the at least one vaporized chemical etching operation. A part of the trimmed interlayer dielectric layer 207b along sidewalls of the protruding structures 203 may act as a spacer in the case without spacers, and thus the formation of spacers may be omitted.

Figure 2F:
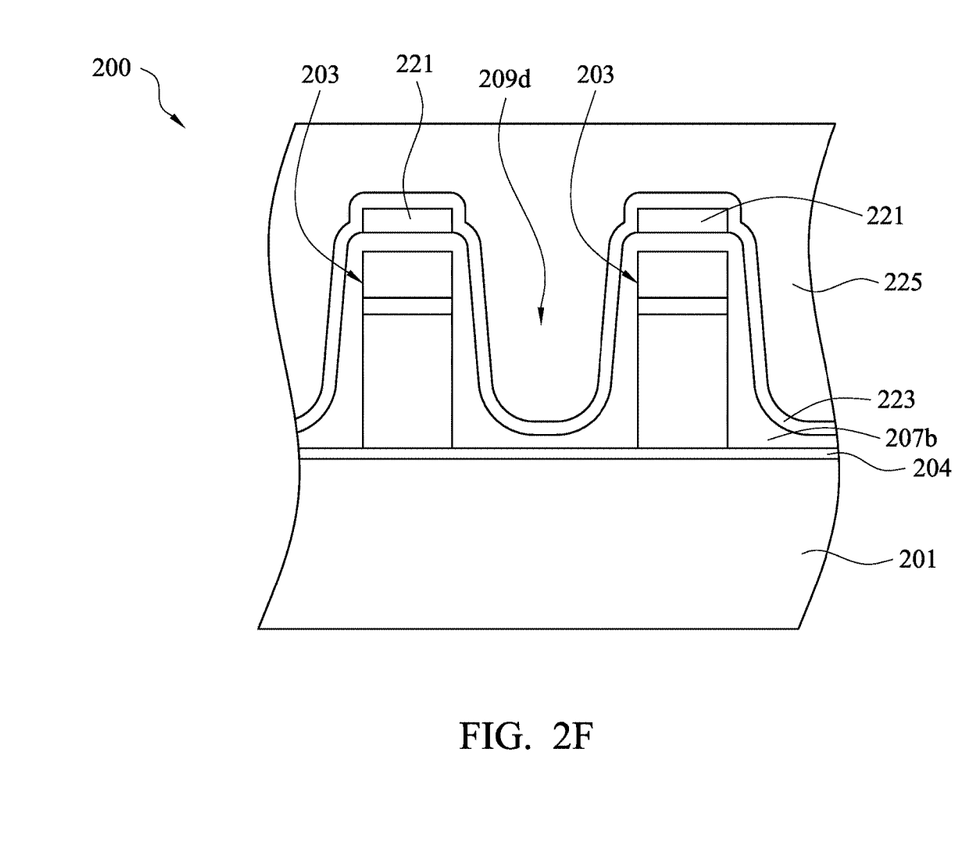

Later, as shown in FIG. 2F, a gap filling material 225 may fill the gap 209 along the interlayer dielectric layer 207b, in which the gap filling material 225 in the gap 209 has no void substantially. Such profile of the interlayer dielectric layer 207b may enlarge the subsequent deposition process window and prevent voids from remaining inside the oxide layer filler in the gap 209 without loss of the heights and widths of the spacers (i.e. the spacers 208 of FIG. 2D or the interlayer dielectric layer 207b of FIG. 2E).

In those embodiments, before the operation of covering the gap 209 and the interlayer dielectric layer 207b, a cap layer 221 may be optionally aligned and formed on the upper portion of each protruding structure 203, for providing more protection to the protruding structure 203. Another passivation layer 223 comprising silicon oxynitride (SiON) or other appropriate materials may be formed optionally and conformally above the interlayer dielectric layer 207b and the cap layer 221, as shown in FIG. 2D.

FIG. 3 is a flow chart of a method 300 of manufacturing a semiconductor structure in accordance with embodiments. In Operation 301, a silicon substrate is provided. In Operation 303, at least two protruding structures are formed on a silicon substrate, in which every two adjacent protruding structures are spaced at a gap. In Operation 305, an interlayer dielectric layer is formed conformally over the protruding structures and a surface of the silicon substrate in the gap, in which the interlayer dielectric layer has a top portion and a bottom portion in the gap, the bottom portion adjoining the top portion, the top portion is located near tops of the protruding structures, and the bottom portion is located near bottoms of the protruding structures. In Operation 307, a vaporized chemical etching operation is performed to etch the top portion of the interlayer dielectric layer at a first etching rate and the bottom portion of the interlayer dielectric layer at a second etching rate that is smaller than the first etching rate, thereby adjusting the gap to have a desired gap profile with an aspect ratio of not less than 4.

In the aforementioned embodiments, the at least one vaporized chemical etching operation applied in the method of manufacturing the semiconductor structure may tune and adjust a better cross-sectional profile of the gap 209 instead of the typical process such as BARC coating and wet etching of spacers. The cross-sectional profile of the gap 209 may be controlled to a thinner top portion 211 and a wider bottom corner 215 of the interlayer dielectric layer 207a, for enlarging the gap-filling performance of the gap 209.

In accordance with an embodiment, the present disclosure discloses a method of manufacturing a semiconductor structure. Firstly, a silicon substrate is provided. Next, at least two gate structures are formed adjacently on the silicon substrate, in which every two adjacent gate structures are spaced at a gap. Then, an interlayer dielectric layer is formed conformally over the gate structures and a surface of the silicon substrate in the gap, in which the interlayer dielectric layer has a top portion and a bottom portion in the gap, the top portion is located near tops of the gate structures, and the bottom portion is located near bottoms of the gate structures. Subsequently, a vaporized chemical etching operation is performed to etch the top portion of the interlayer dielectric layer at a first etching rate and the bottom portion of the interlayer dielectric layer at a second etching rate that is smaller than the first etching rate, thereby adjusting the gap to have a desired gap profile with an aspect ratio of not less than 4.

In accordance with another embodiment, the present disclosure discloses a method of manufacturing a semiconductor structure. Firstly, at least two protruding structures are formed on a silicon substrate. Next, an interlayer dielectric layer is formed conformally over the protruding structures and a surface of the silicon substrate in the gap, in which the interlayer dielectric layer has a top portion and a bottom portion in the gap, the bottom portion adjoining the top portion, the top portion is located near tops of the protruding structures, and the bottom portion is located near bottoms of the protruding structures. Then, a first vaporized chemical etching operation is performed to etch the top portion of the interlayer dielectric layer at a first etching rate and the bottom portion of the interlayer dielectric layer at a second etching rate that is equal to or smaller than the first etching rate. Subsequently, at least one second vaporized chemical etching operation is performed by adjusting the first etching rate to be a third etching rate to etch the top portion of the interlayer dielectric layer and adjusting the second etching rate to be a fourth etching rate to etch the bottom portion of the interlayer dielectric layer until the gap has a desired gap profile, in which the fourth etching rate is smaller than the third etching rate, and the desired gap profile has an aspect ratio of not less than 4.

In accordance with yet another embodiment, the present disclosure discloses a semiconductor structure. The semiconductor structure includes a silicon substrate, at least two gate structures disposed adjacently on the silicon substrate, and an interlayer dielectric layer disposed conformally over the gate structures and a surface of the silicon substrate. Each of the at least two gate structures includes a gate polysilicon layer, a dielectric layer disposed on the gate polysilicon layer, a control gate layer disposed on the dielectric layer, and spacers disposed along sidewalls of the gate polysilicon layer, the dielectric layer and the control gate layer. The interlayer dielectric layer between the two adjacent gate structures includes a gap, the gap profile has a target aspect ratio that is not less than 4, a first angle and a second angle, in which the first angle included between a top surface and a top sidewall of the interlayer dielectric layer is in a range substantially from 91 degrees to 97 degrees, and the second angle between a bottom sidewall and a bottom surface of the interlayer dielectric layer is at least 91 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a silicon substrate;
   forming at least two protruding structures over the silicon substrate, wherein every two adjacent protruding structures are spaced apart by a gap;
   forming an interlayer dielectric layer conformally over the protruding structures and a surface of the silicon substrate in the gap, wherein the interlayer dielectric layer has a top portion and a bottom portion in the gap, the top portion is located near tops of the protruding structures, and the bottom portion is located near bottoms of the protruding structures; and
   performing a vaporized chemical etching operation to etch the top portion of the interlayer dielectric layer at a first etching rate and the bottom portion of the interlayer dielectric layer at a second etching rate that is smaller than the first etching rate, thereby adjusting the gap profile with an aspect ratio of not less than 4.

2. The method of claim 1, wherein the first etching rate is controlled by a source power of an etching tool, and the second etching rate is controlled by a bias power of the etching tool, and a ratio of the source power to the bias power is at least 10/1.

3. The method of claim 1, wherein the ratio of the source power to the bias power is in a range substantially from 10/1 to 20/1.

4. The method of claim 1, wherein a thickness of the top portion of the interlayer dielectric layer is reduced by a first thickness, a bottom corner of the interlayer dielectric layer is reduced by a second thickness, and a ratio of the first thickness to the second thickness is in a range substantially from 1/1 to 30/1 after the at least one vaporized chemical etching operation.

5. The method of claim 4, wherein the ratio of the first thickness to the second thickness is in a range substantially from 1/1 to 10/1.

6. The method of claim 4, wherein the ratio of the first thickness to the second thickness is in a range substantially from 1/1 to 5/1.

7. The method of claim 1, wherein the desired gap profile has a first angle included between a top surface of the interlayer dielectric layer and a top sidewall of the interlayer dielectric layer, a second angle included between a bottom sidewall of the interlayer dielectric layer and a bottom surface of the interlayer dielectric layer, the second angle is not less than the first angle, and the second angle is not less than the first angle, and the second angle is at least 91 degrees.

8. The method of claim 7, wherein the first angle is in a range substantially from 91 degrees to 97 degrees, and the second angle is in a range substantially from 91 degrees to 126 degrees.

9. The method of claim 1, further comprising:
   forming a plurality of spacers along sidewalls of the protruding structures.

10. A method of manufacturing a semiconductor structure, comprising:
   forming at least two protruding structures adjacently over a silicon substrate, wherein every two adjacent protruding structures are spaced apart by a gap;
   conformally forming an interlayer dielectric layer over the protruding structures and a surface of the silicon substrate in the gap, wherein the interlayer dielectric layer has a top portion and a bottom portion in the gap, the bottom portion adjoining the top portion, the top portion is located near tops of the protruding structures, and the bottom portion is located near bottoms of the protruding structures;
   performing a first vaporized chemical etching operation to etch the top portion of the interlayer dielectric layer at a first etching rate and the bottom portion of the interlayer dielectric layer at a second etching rate that is equal to or smaller than the first etching rate; and
   performing at least one second vaporized chemical etching operation by adjusting the first etching rate to be a third etching rate to etch the top portion of the interlayer dielectric layer and adjusting the second etching rate to be a fourth etching rate to etch the bottom portion of the interlayer dielectric layer until the gap has a desired gap profile, wherein the fourth etching rate is smaller than the third etching rate, and the desired gap profile has an aspect ratio of not less than 4.

11. The method of claim 10, wherein the first etching rate is adjusted by controlling a source power of an etching tool, and the second etching rate is adjusted by controlling a bias power of the etching tool, and a ratio of the source power to the bias power is at least 10/1.

12. The method of claim 11, wherein the ratio of the source power to the bias power is in a range substantially from 10/1 to 20/1.

13. The method of claim 10, wherein the desired gap profile has a first angle included between a top surface and a top sidewall of the interlayer dielectric layer, and a second angle included between a bottom sidewall and a bottom surface of the interlayer dielectric layer, the second angle is not less than the first angle, and the second angle is at least 91 degrees.

14. The method of claim 13, wherein the first angle is in a range substantially from 91 degrees to 97 degrees, and the second angle is in a range substantially from 91 degrees to 126 degrees.

15. The method of claim 10, wherein a thickness of the top portion of the interlayer dielectric layer is reduced by a first thickness, and the bottom portion of the interlayer dielectric layer is reduced by a second thickness, and a ratio of the first thickness to the second thickness is in a range substantially from 1/1 to 30/1 after the first and second vaporized chemical etching operations are performed.

16. The method of claim 15, wherein the ratio of the first thickness to the second thickness is in a range substantially from 1/1 to 10/1.

17. The method of claim 15, wherein the ratio of the first thickness to the second thickness is in a range substantially from 1/1 to 5/1.

18. The method of claim 10, after the vaporized chemical etching operations are performed, further comprising:

forming a gap filling material to cover blanketly the gap and the interlayer dielectric layer, wherein the gap filling material in the gap has no void substantially.

19. A method of manufacturing a semiconductor structure, comprising:
   forming at least two protruding structures adjacently over a silicon substrate, wherein every two adjacent protruding structures are spaced apart by a gap, each of the protruding structures comprising:
   a gate polysilicon layer;
   a dielectric layer disposed on the gate polysilicon layer; and
   a control gate layer disposed on the dielectric layer;
   conformally forming an interlayer dielectric layer over the protruding structures and a surface of the silicon substrate in the gap, wherein the interlayer dielectric layer has a top portion and a bottom portion in the gap, the bottom portion adjoining the top portion, the top portion is located near tops of the protruding structures, and the bottom portion is located near bottoms of the protruding structures;
   performing a first vaporized chemical etching operation to etch the top portion of the interlayer dielectric layer at a first etching rate and the bottom portion of the interlayer dielectric layer at a second etching rate that is equal to or smaller than the first etching rate; and
   performing at least one second vaporized chemical etching operations by adjusting the first etching rate to be a third etching rate to etch the top portion of the interlayer dielectric layer and adjusting the second etching rate to be a fourth etching rate to etch the bottom portion of the interlayer dielectric layer until the gap has a desired gap profile, wherein the fourth etching rate is smaller than the third etching rate, and the desired gap profile has an aspect ratio of not less than 4.

20. The method of claim 19, wherein the gate polysilicon layer is a floating gate polysilicon layer, and the gate polysilicon layer and the control gate polysilicon layer is doped with impurities.

* * * * *